(12) United States Patent
Saarinen et al.

(10) Patent No.: US 9,692,258 B2
(45) Date of Patent: Jun. 27, 2017

(54) METHOD AND SYSTEM FOR MULTI-IED EVENT CLASSIFICATION IN AN ELECTRICAL GRID

(71) Applicant: ABB Research Ltd., Zurich (CH)

(72) Inventors: Kari Saarinen, Vasteras (SE); Mirrasoul Mousavi, Cary, NC (US)

(73) Assignee: ABB Research Ltd., Zurich (CH)

( * ) Notice: Subject to any disclaimer, the term of this patent is extended or adjusted under 35 U.S.C. 154(b) by 657 days.

(21) Appl. No.: 14/099,659

(22) Filed: Dec. 6, 2013

(65) Prior Publication Data

US 2015/0160296 A1    Jun. 11, 2015

(51) Int. Cl.
| G01R 31/00 | (2006.01) |
| H02J 13/00 | (2006.01) |
| G01R 19/25 | (2006.01) |

(52) U.S. Cl.
CPC ........ H02J 13/001 (2013.01); G01R 19/2513 (2013.01); *Y02E 60/724* (2013.01); *Y02E 60/74* (2013.01); *Y04S 10/18* (2013.01); *Y04S 10/30* (2013.01); *Y04S 10/40* (2013.01)

(58) Field of Classification Search
None
See application file for complete search history.

(56) References Cited

U.S. PATENT DOCUMENTS

| 6,018,449 | A * | 1/2000 | Nelson | H02H 1/0092 |
| | | | | 361/64 |
| 6,593,562 | B1 * | 7/2003 | Parrish | H01L 27/14609 |
| | | | | 250/208.1 |
| 8,000,910 | B2 | 8/2011 | Bickel | |
| 8,411,577 | B2 * | 4/2013 | Ge | G06F 11/0709 |
| | | | | 370/216 |
| 2003/0067725 | A1 * | 4/2003 | Horvath | H02H 7/261 |
| | | | | 361/65 |
| 2003/0117279 | A1 * | 6/2003 | Ueno | G06K 9/00335 |
| | | | | 340/523 |
| 2003/0172150 | A1 * | 9/2003 | Kennedy | H04L 41/069 |
| | | | | 709/224 |
| 2009/0281740 | A1 * | 11/2009 | Stoupis | G01R 31/024 |
| | | | | 702/58 |

(Continued)

FOREIGN PATENT DOCUMENTS

| EP | 2390980 A1 | 11/2011 |
| WO | 2008134995 A1 | 11/2008 |
| WO | 2008151740 A1 | 12/2008 |

OTHER PUBLICATIONS

European Search Report Application No. EP 12 15 2569 Completed: Jun. 13, 2012 3 pages.

*Primary Examiner* — David M Gray
*Assistant Examiner* — Geoffrey T Evans
(74) *Attorney, Agent, or Firm* — Whitmyer IP Group LLC

(57) ABSTRACT

A method of classifying an event in an electrical grid. The method utilizes event related data provided by intelligent electronic devices and provides the operator with a single conclusion classifying the event, thereby helping the operator to determine the mitigation actions. The method includes receiving individual event related data from each intelligent electronic device, and determining whether the event is a fault or a non-fault based on probabilistic methods applied to the event related data. A corresponding system is also presented herein.

13 Claims, 4 Drawing Sheets

(56) References Cited

U.S. PATENT DOCUMENTS

| | | | |
|---|---|---|---|
| 2010/0145647 A1* | 6/2010 | Bouchard | G03G 15/5079 |
| | | | 702/85 |
| 2010/0161835 A1 | 6/2010 | Syed et al. | |
| 2011/0012603 A1* | 1/2011 | Bose | G01R 31/3274 |
| | | | 324/418 |
| 2011/0144931 A1 | 6/2011 | Smit | |
| 2012/0004869 A1* | 1/2012 | Saarinen | G01R 31/3274 |
| | | | 702/59 |
| 2012/0010830 A1* | 1/2012 | Saarinen | G01R 31/3274 |
| | | | 702/58 |
| 2012/0066172 A1* | 3/2012 | Jebara | G06K 9/6297 |
| | | | 706/52 |
| 2013/0073108 A1* | 3/2013 | Kolwalkar | G01R 19/2513 |
| | | | 700/298 |
| 2013/0194299 A1* | 8/2013 | Saarinen | G05B 23/0216 |
| | | | 345/629 |
| 2013/0198124 A1* | 8/2013 | Saarinen | G06N 5/02 |
| | | | 706/46 |
| 2015/0215155 A1* | 7/2015 | Chow | H04W 4/006 |
| | | | 370/242 |

* cited by examiner

METHOD AND SYSTEM FOR MULTI-IED EVENT CLASSIFICATION IN AN ELECTRICAL GRID

TECHNICAL FIELD

The present disclosure generally relates to power systems and in particular to event analysis in a substation environment of an electrical grid.

BACKGROUND

The performance and reliability of medium voltage electricity distribution feeders has a significant impact on the quality of service offered by electric utility companies to their commercial, industrial, and residential customers. To that end, reliability of the service and continuity of supply sit on top of every utility's business objectives. Electrical outages, service disruptions, and grid disturbances are however inevitable. They do occur and they are costly to the utility and the society alike. A recent study performed by Lawrence Berkeley National Laboratory in the United States reports that unreliable electrical systems cost $80 BUSD annually due to mainly large number of short disturbances. When interruptions occur, the utility's top priority is to address the outages as quickly as possible and restore the power to as many customers as possible.

The effectiveness of all network operations, particularly outage management, depends heavily on availability of information systems that deliver the right information to the right operator at the right time.

Asset failures and faults resulting in interruptions as well as normal network operations manifest themselves in voltage and current excursions which are called events. These events are captured by Intelligent Electronic Devices (IEDs) and stored as raw data in digital files. The recorded raw waveforms are seldom utilized for real-time and accurate decision making due to the lack of time, resources, and appropriate tools.

In order to improve the controllability and reliability of electrical networks, increasing number of measurement points and various kinds of intelligent electronic devices are installed. Often times, there is a redundancy in data as for example IEDs electrically connected to the same bus will capture multiple manifestations of a single event.

Microprocessor-based digital systems including protection IEDs and sensors used in distribution networks produce a lot of raw data that need to be analysed and processed for various decisions making functions ranging from protection to monitoring to control actions. Most often, the digital systems are put in place to replace the legacy electromechanical systems and configured to deliver the same functionalities as their legacy counterparts did. As such, advanced data-based methods and decision support tools are not widely used leading to a substantial underutilization of digital data. In the midst of rising data volumes and shrinking engineering work force, it is increasingly infeasible for the grid operators to deal with this "data tsunami" and make an effective use of the data that is often correlated and redundant.

In particular, the raw data captured by IEDs as disturbance records are rarely of direct benefit beyond its occasional use by protection engineers. Traditionally, the analysis has been strictly a manual process. One or more analysts would become familiar with the data and, with the help of statistical techniques, provide summaries and generate reports. However, such an approach is rapidly breaking down as the quantity of data grows so fast that manual analysis, even if possible, simply cannot keep pace.

SUMMARY

The present inventors have previously developed a method able to automatically capture, analyse, and interpret feeder events that are captured by a single feeder protection IED installed on e.g. a medium voltage substation bus. By that method the IED can classify the event by determining the probability of the event being a fault or a non-fault in the primary monitoring zone of that IED or in an adjacent monitoring zone i.e. a monitoring zone of the same medium voltage substation bus for a different feeder. Moreover, the method further provides for determining the type of fault or non-fault. A document disclosing this matter is U.S. patent application Ser. No. 13/155,236 entitled "System and method for classifying power line events", which is hereby incorporated by reference.

An object of the present disclosure is to provide a method for a real-time system that synthesizes data from multiple IEDs and provides the operator with a single conclusion describing the event thereby helping the operator to determine the mitigation actions.

In particular, an object is to provide a method that classifies an event in a multi-IED environment.

Hence, in a first aspect of the present disclosure there is provided a method of classifying an event in an electrical grid, wherein the method comprises: receiving individual event related data from intelligent electronic devices; arranging, in a data structure, classes of probability values pertaining to the individual event related data, that according to a first class the event is an adjacent monitoring zone fault and that according to a second class the event is an adjacent monitoring zone non-fault, or that according to a third class the event is a primary monitoring zone fault and that according to a fourth class the event is a primary monitoring zone non-fault for each intelligent electronic device, a primary monitoring zone of an intelligent electronic device being a monitoring zone which that intelligent electronic device is assigned to monitor and an adjacent monitoring zone of an intelligent electronic device being a monitoring zone that is not a primary monitoring zone for that intelligent electronic device; selecting in the data structure a highest probability value from each of the first class and the second class, or each of the third class and the fourth class, for each intelligent electronic device; determining a respective total probability that the event belongs to the first class based on the highest probability values from the first class, that the event belongs to the second class based on the highest probability values from the second class, that the event belongs to the third class based on the highest probability values from the third class, and that the event belongs to the fourth class based on the highest probability values from the fourth class; and determining whether the event is a fault or a non-fault based on the total probabilities of the first class, the second class, the third class and the fourth class.

Thus, an operator will not be flooded with data provided by a multitude of IEDs for event classification purposes. By means of the present disclosure, it is hence possible to provide a single conclusion to an operator of whether the event is a fault or a non-fault based on the input, i.e. the event related data, from two or more intelligent electronic devices (IEDs).

By individual event related data is meant that each IED provides individual event related data as input to the method.

One embodiment comprises determining a scaled total probability for each total probability using prior probabilities that the event is a fault or a non-fault, wherein the determining whether the event is a fault or a non-fault is based on the scaled total probabilities. By determining a respective scaled probability based on prior probabilities, more realistic probabilities can be determined because prior knowledge regarding events is taken into account. Moreover, the scaled probabilities take into account that there may be a different number of terms in the first and the second classes as compared to the third and the fourth classes. This is beneficial if for instance there is a single event in an N-IED system with N being the number of IEDs, and the third and the fourth class consist of one single value probability value whereas the first and the second class consist of N−1 values, all less than zero. In embodiments where the total probabilities are values of joint density functions which are multiplications of individual class probabilities, the resulting multiplication of the first and second classes will result in very small numbers. In these situations the scaling provides compensation.

One embodiment comprises determining a fault value based on the scaled total probabilities of the first class and the third class, and a non-fault value based on the scaled probabilities of the second class and the fourth class, wherein the determining whether the event is a fault or a non-fault is determined based on the largest of the fault value and the non-fault value.

According to one embodiment, the arranging comprises associating the probability values of each row of the data structure with a specific intelligent electronic device.

According to one embodiment the arranging comprises associating each column of the data structure, in rows associated with intelligent electronic devices associated with probabilities that the event is a first class or second class event, with a fault or non-fault adjacent monitoring zone subclass.

According to one embodiment the arranging comprises associating each column of the data structure, in rows associated with intelligent electronic devices associated with probabilities that the event is a third class or fourth class event, with a primary monitoring zone fault or non-fault subclass.

By associating each row and each column with an IED and a class, respectively, the data structure can be scanned in a structured manner for data contained in its cells. It is to be noted that these are only examples of possible configurations of the data structure.

One embodiment comprises determining the number of third class probability values and the number of fourth class probability values.

One embodiment comprises, in case it has been determined that the event is a fault and if the number of third class probability values is greater than zero, determining a probability for each primary monitoring zone fault subclass, and determining the type of primary monitoring zone fault by selecting the greatest value of the probabilities. Thus, when it has been determined that the event is a fault, and there is a probability that the event is primary monitoring zone event, the specific fault from the set of fault types in the primary monitoring zone fault subclass can be determined.

One embodiment comprises, in case it has been determined that the event is a fault, and if the number of third class probability values is equal to zero, determining a probability for each adjacent monitoring zone fault subclass, and determining the type of adjacent monitoring zone fault by selecting the greatest value of the probabilities. Thus, when it has been determined that the event is a fault, and the event is an adjacent monitoring zone event, the specific fault from the set of fault types in the adjacent monitoring zone fault subclass can be determined. Typically, adjacent monitoring zone faults may differ from primary monitoring zone faults in that there are more specific fault types which can be determined in the primary monitoring zone fault subclass e.g. because the signal-to-noise ratio is greater when an event is captured in a primary monitoring zone of one of the IEDs. The measurement data thereby captured typically can provide more information than if the measurement data pertains to an adjacent monitoring zone.

One embodiment comprises, in case it has been determined that the event is a non-fault, and if the number of fourth class probability values is greater than zero, determining a probability for each primary monitoring zone non-fault subclass, and determining the type of primary monitoring zone non-fault by selecting the greatest value of the probabilities. Thus, when it has been determined that the event is a non-fault, and the event is a primary monitoring zone event, the specific non-fault from the set of non-fault types in the primary monitoring zone non-fault subclass can be determined.

One embodiment comprises, in case it has been determined that the event is a non-fault, and if the number of fourth class probability values is zero, determining a probability for each adjacent monitoring zone non-fault subclass, and determining the type of adjacent monitoring non-fault by selecting the greatest value of the probabilities. Thus, when it has been determined that the event is a non-fault, and the event is an adjacent monitoring zone event, the specific non-fault from the set of non-fault types in the adjacent monitoring zone non-fault subclass can be determined.

According to a second aspect of the present disclosure there is provided a computer program product comprising computer-executable components for causing a system to perform the steps according to the first aspect when the computer-executable components are run on a processing unit included in the system.

According to a third aspect of the present disclosure there is provided a system for classifying an event in an electrical grid, wherein the system comprises: an input unit arranged to receive individual event related data from intelligent electronic devices; and a processing unit configured to arrange, in a data structure, classes of probability values pertaining to the individual event related data, that according to a first class the event is an adjacent monitoring zone fault and that according to a second class the event is an adjacent monitoring zone non-fault, or that according to a third class the event is a primary monitoring zone fault and that according to a fourth class the event is a primary monitoring zone non-fault for each intelligent electronic device, a primary monitoring zone of an intelligent electronic device being a monitoring zone which that intelligent electronic device is assigned to monitor and an adjacent monitoring zone of an intelligent electronic device being a monitoring zone that is not a primary monitoring zone for that intelligent electronic device, wherein the processing unit is further configured to select in the data structure a highest probability value from each of the first class and the second class, or each of the third class and the fourth class, for each intelligent electronic device, to determine a respective total probability that the event belongs to the first class based on the highest probability values from the first class, that the event belongs to the second class based on the highest probability values from the second class, that the event belongs to the third class based on the highest probability values from the third class, and that the event belongs to the fourth class based on the highest probability values from the fourth class, and to determine whether the event is a fault or a non-fault based on the total probabilities of the first class, the second class, the third class and the fourth class.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. It is to be noted that, although the steps of the methods presented herein are referred to by numbers; a particular step may for instance be called "a first step", the steps of any method disclosed herein do not have to be performed in the exact order disclosed, unless explicitly stated. Moreover, not all steps have to be executed within one physical system; the whole process can be broken down and distributed among multiple processors or IEDs. In particular, one of the IEDs can be designated as a master IED that receives input from all other IEDs and performs the final information synthesis.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
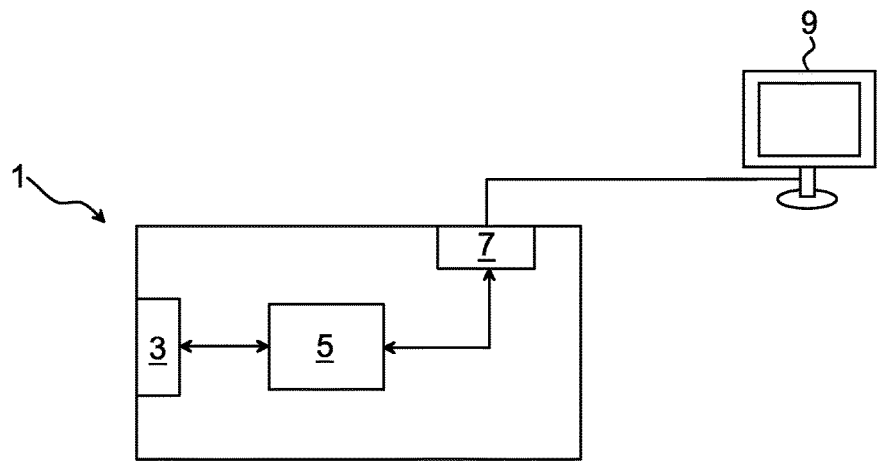
FIG. 1 shows a schematic view of a system for classifying an event in an electrical grid.

FIG. 1 depicts a system 1 for identifying at least one monitoring zone subject to an event in an electrical grid. System 1 may typically be used in a substation environment of a power distribution network or a power transmission network.

The system 1 comprises an input unit 3, a processing unit 5, and an output unit 7. The input unit 3 is arranged to receive event related data from intelligent electronic devices (IEDs) in a power distribution network. The IEDs may for instance be arranged in a power distribution network or a power transmission network.

The processing unit 5 is arranged to process the event related data. The processed event related data can be sent to the output unit 7 and further to a display device 9. The processed event related data can thereby be presented to e.g. an operator.

The processing unit 5 may be in the form of one or more microprocessors able to execute components of appropriate software stored in associated memory for procuring required functionality. However, other suitable devices with computing capabilities could be used, e.g. an application specific integrated circuit (ASIC), a field programmable gate array (FPGA) or a complex programmable logic device (CPLD).

In one embodiment, the input unit 3 is arranged to receive command data from e.g. an operator. In this embodiment, the output unit 7 is arranged to send the command data, either processed by the processing unit 5 or unprocessed, to a communications network N shown in FIG. 2 for communication with for instance IEDs connected to the network N.

Figure 2:
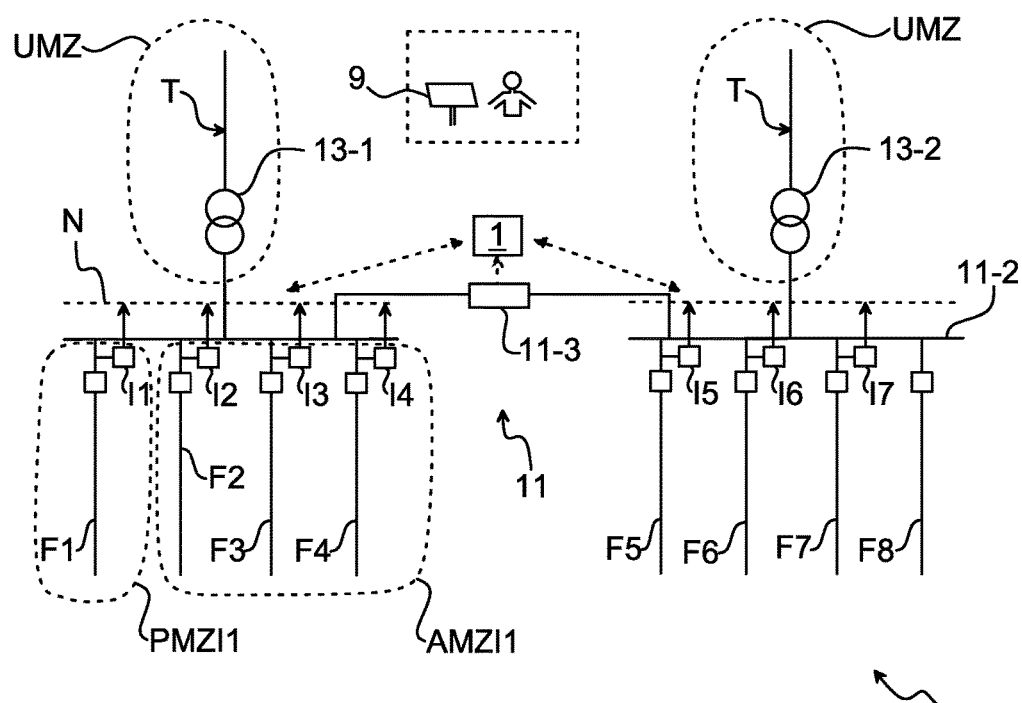
FIG. 2 shows a schematic view of power distribution network in a substation environment and the system in FIG. 1.

In the following the system 1 will be exemplified by arrangement in a power distribution network substation environment, as shown in FIG. 2. It is however to be noted that the system 1 may equally well be used in a power transmission network environment. FIG. 2 shows a portion of a power distribution network D in a substation environment, i.e. in the vicinity of a substation that forms an interface between the distribution network D and a transmission network T. A substation typically has two voltage levels. These voltage levels are referred to as a primary side and a secondary side, with the primary side being connected to the transmission network T, and the secondary side being connected to the distribution network D.

The example in FIG. 2 illustrates a busbar system 11 having a first bus 11-1 and a second bus 11-2 connectable via a bus tie 11-3. The first bus 11-1 is connected to the transmission network T via a first power transformer 13-1. The second bus 11-2 is connected to the transmission network T via the second power transformer 13-2.

The busbar system 11 is connectable to a plurality of feeders F1-F8 which form part of the distribution network D. Feeders F1-F4 are associated with the first bus 11-1 and feeders F5-8 are associated with the second bus 11-2. The feeders F1-F8 are arranged to distribute power from the transmission network T to end customers such as commercial, industrial, and residential customers.

IEDs I1-I7 are arranged to monitor a respective feeder F1-F7. The IEDs process measured feeder signals such as current and voltage values. In case of an event, each IED which detects the event creates first event related data which is provided to the system 1 for processing by the processing unit 5. The IEDs I1-I7 and the system 1 can be connected to the communications network N such that they are able to communicate.

Each feeder F1-F8 defines an event zone which can be monitored by one or more IEDs. In the example of FIG. 2, each of the feeders F1-F7 defines an event zone which is monitored by a respective IED I1-I7.

Event zones can be divided into primary monitoring zones (PMZ) and non-primary monitoring zones. An event zone is a primary monitoring zone of that IED which is assigned to monitor that specific event zone. The remaining feeder zones of the bus are adjacent monitoring zones (AMZ) of that IED. Event zones which are adjacent monitoring zones to all IEDs and an event zone having a power level differing from a power level monitored by the intelligent electronic devices I1-I7 define a non-primary monitoring zone. In the example of FIG. 2, the event zone on the transmission network T side, which is not monitored by the IEDs I1-I7, is called the upstream monitoring zone UMZ, because it is in the transmission network T upstream of the busbar system 11.

Thus, according to the example of FIG. 2, the adjacent monitoring zones and the upstream monitoring zone of an IED together form a non-primary monitoring zone of that IED.

As an example, assuming that the breaker of the bus tie 11-3 is open, primary monitoring zone PMZI1 is the primary monitoring zone of IED I1 in FIG. 2, and its adjacent monitoring zone is AMZI1 which comprises feeders F2-F4 which are monitored by IEDs I2-I4. Thus, feeders F2-F4 and the upstream monitoring zone UMZ form a non-primary monitoring zone of IED 1. If the bus tie 11-3 breaker is closed, the adjacent monitoring zone of IED I1 would also include feeders F5-F8, and thus the non-primary monitoring zone of IED I1 would include feeders F2-F8 and the upstream monitoring zone UMZ.

According to the example in FIG. 2, feeder F8 on the second bus 11-2 is not monitored by any IED. It is however to be understood that all feeders can have at least one IED assigned to it for monitoring purposes.

Figure 3:
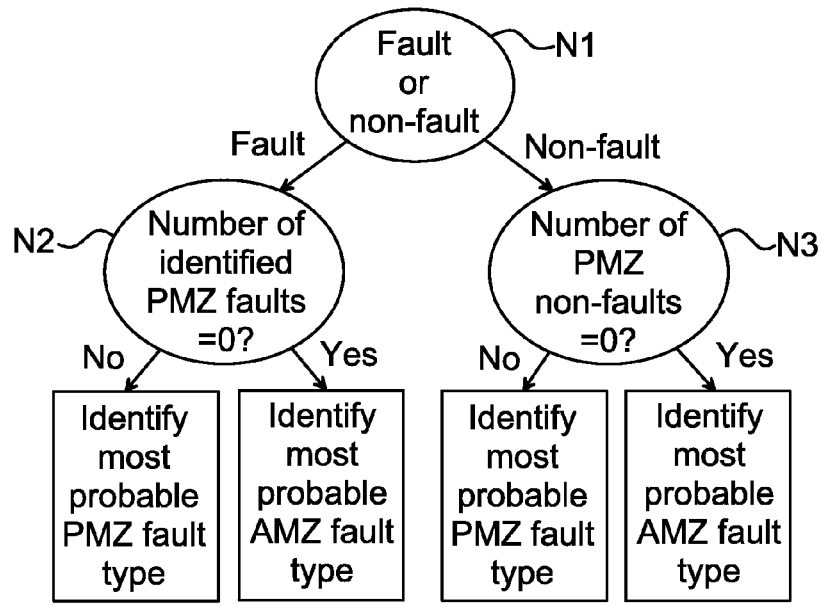
FIG. 3 shows a decision tree for classification of an event in a multi-IED environment.
Figure 4:
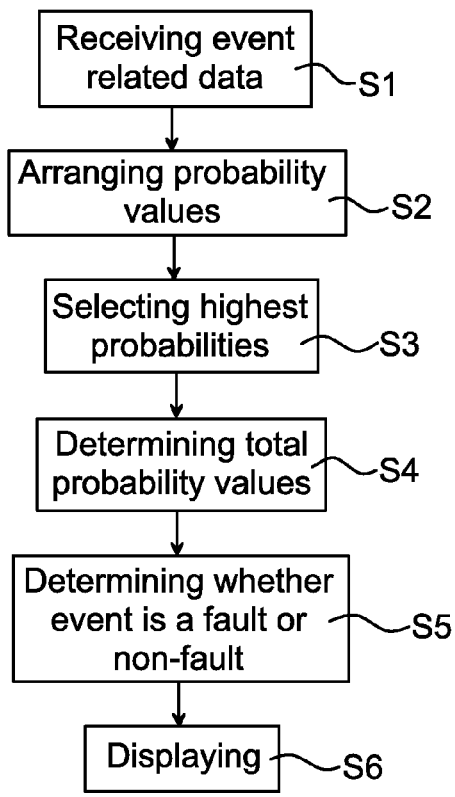
FIG. 4 is a flowchart for classifying an event in a power distribution network substation environment.

FIG. 3 is a decision tree for classifying an event, for instance in a power distribution network substation environment such as the one depicted in FIG. 2. The decision tree has a first node N1, a second note N2, and a third node N3 where decisions are taken, as will be explained in detail in what follows with reference to FIGS. 3 and 4.

In a first step S1, individual event related data is received by the input unit 3 of system 1 from each IED I1-I7.

Event related data means data relating to an event. Event related data provided by an IED may for instance comprise a classification of the event as determined by that IED which provided the event related data. Thus each individual event related data may comprise a local classification of the event as determined by the respective IED. Event classification can typically be made at a first level to determine whether the event is a fault or a non-fault and at a second level to determine what kind of fault or non-fault the event relates to. The classification may be in the form of probability values of different subclasses of the second level. Such methods are described in the previously referred to U.S. patent application Ser. No. 13/155,236, and the classification may for instance be made by means of equation (35) on page 40.

In such cases where the IEDs are not equipped with software that enable them to determine individual event classifications the event related data may comprise measurement data of the event, wherein the computations of the individual event classifications pertaining to each IED can be made for example by the processing unit 5 in system 1 based on the measurement data from each IED.

Typically, an event may be classified into to two broad main classes, namely fault or non-fault. Each of these main classes can be divided into subclasses. Depending on the monitoring zone in which the event is estimated to occur, these subclasses may differ. In particular there may be more fault subclasses for a primary monitoring zone fault than for an adjacent monitoring zone fault due to notable differences in signal-to-noise ratios between primary monitoring zone events and adjacent monitoring zone events. Examples of subclasses are illustrated in table 1 below.

TABLE 1

| Zone | Super Class | Numerical Subclass Label | Detailed Class Type |
|---|---|---|---|
| PMZ | Faults ("Class 3") | 1 | Short-duration Feeder Fault Type I |
|  |  | 2 | Short-duration Feeder Fault Type II |
|  |  | 3 | Short-duration Feeder Fault Type III |
|  |  | 4 | Long-duration Feeder Fault |
|  | Non-Faults ("Class 4") | 5 | Switching Transient |
|  |  | 6 | Inrush/Load Pick-up |
| AMZ | Faults ("Class 1") | 1 | Short-duration Feeder Fault |
|  |  | 2 | Long-duration Feeder Fault |
|  | Non-Faults ("Class 2") | 3 | Switching Transient Type I |
|  |  | 4 | Switching transient Type II |
| UMZ | None | 1 | All events |

In a second step S2, classes of probability values pertaining to the individual event related data are arranged in a data structure such as a matrix. Each class of probability value pertains to a subclass of a fault or a non-fault in a primary monitoring zone or an adjacent monitoring zone. Thus, in embodiments where the event related data contains individual event classifications, e.g. fault or non-fault subclass probabilities, these probabilities are arranged in the data structure. Also in those cases when the event related data contains simple measurement data and the individual event classification is carried out e.g. in system 1, it is the calculated fault or non-fault subclass probabilities that are arranged in the data structure.

For each IED I1-I7 the probability values are classified according to a first class that the event is an adjacent monitoring zone fault and according to a second class the event is an adjacent monitoring zone non-fault, or that according to a third class the event is a primary monitoring zone fault and that according to a fourth class the event is a primary monitoring zone non-fault. For each IED I1-I7 the probability values are arranged in the data structure.

In one embodiment the arranging comprises associating the probability values of each row of the data structure with a specific intelligent electronic device.

In one embodiment the arranging comprises associating each column of the data structure, in rows associated with intelligent electronic devices associated with probabilities that the event is a first class or second class event, with a fault or non-fault adjacent monitoring zone subclass.

In one embodiment the arranging comprises associating each column of the data structure, in rows associated with intelligent electronic devices associated with probabilities that the event is a third class or fourth class event, with a primary monitoring zone fault or non-fault subclass.

The data structure may for instance have the following form.

$$R = \begin{bmatrix} R[1,1] & R[1,2] & R[1,3] & R[1,4] & R[1,5] & R[1,6] \\ R[2,1] & R[2,2] & R[2,3] & R[2,4] & & \\ R[3,1] & R[3,2] & R[3,3] & R[3,4] & & \\ R[4,1] & R[4,2] & R[4,3] & R[4,4] & R[4,5] & R[4,6] \\ R[5,1] & R[5,2] & R[5,3] & R[5,4] & & \end{bmatrix} \quad (1)$$

In the example of equation (1), each row of the data structure R is associated with an IED. Row 1 may for example be associated with IED I1, row 2 with IED I2, row 3 with IED I3, row 4 with IED I4 and row 5 with IED I5. Each row is furthermore associated with the first class and the second class or the third class and the fourth class. In particular, each column of a specific row is associated with one of the first class and the second class or the third class and the fourth class. Each column is also associated with a subclass associated with the main class, i.e. first class, second class, third class, or fourth class, of that column. For example those IEDs for which the individual event related data is classified to be a primary monitoring zone event, the therewith associated probabilities for the subclasses of the third class and the fourth class are accordingly arranged in the data structure. In the present example six probability values are arranged in row 1 of the data structure because the individual event related data of IED I1 relates to a primary monitoring zone event. Data structure elements R[1,1], R[1,2], R[1,3], R[1,4] are probability values for the different primary monitoring zone fault subclasses, i.e. subclasses to the third class, shown in table 1. Data structure elements R[1,5] and R[1,6] are probability values for the different primary monitoring zone non-fault subclasses, i.e. subclasses to the fourth class, shown in table 1. Similarly, the fourth row shows the corresponding probability values for the fourth IED I4.

Data structure elements R[2,1] and R[2,2] of the second row are probability values for the different adjacent monitoring zone fault subclasses, i.e. subclasses to the first class, shown in table 1 of IED I2. Data structure elements R[2,3] and R[2,4] are probability values for the different adjacent monitoring zone non-fault subclasses, i.e. subclasses to the second class, shown in table 1. Similarly, the third row and the fifth row of the data structure R show the corresponding probability values for the third and the fifth IED I3 and I5, respectively.

According to one embodiment, each probability value may be a $\chi^2$-probability, i.e. each individual IED event classification may be based on a $\chi^2$-distribution.

Matrix elements which are not associated with one of the first class, the second class, the third class and the fourth class, such as R[2,5], may be set to zero or to any other numerical value, and will not be taken into account in the method which will be described in more detail in the following.

In one embodiment, the number of third class probability values and the number of fourth class probability values are determined. This may for instance be performed as the probability values are being arranged in the data structure or after the probability values have been arranged in the data structure. In the data structure R the number of third class probability values is eight, and the number of fourth class probability values is four.

In a third step S3 a highest probability value from each of the first class and the second class, or each of the third class and the fourth class, for each intelligent electronic device is selected in the data structure.

$$R_{P,F}[k] = \max_{i \in I_{P,F}} \{Pr(t_k | E_{p,i})\}, \quad (2)$$

$$R_{P,nF}[k] = \max_{i \in I_{P,nF}} \{Pr(t_k | E_{p,i})\}, k \in M_P$$

$$R_{A,F}[q] = \max_{i \in I_{A,F}} \{Pr(t_q | E_{a,j})\},$$

$$R_{A,nF}[q] = \max_{i \in I_{A,nF}} \{Pr(t_q | E_{a,i})\}, q \in M_A$$

$R_{A,F}$ is the highest probability value for the first class for a specific row, i.e. a specific IED. $R_{A,nF}$ is the highest probability value for the second class for a specific row, i.e. a specific IED. $R_{P,F}$ is the highest probability value for the third class for a specific row, i.e. a specific IED. $R_{P,nF}$ is the highest probability value for the fourth class for a specific row, i.e. a specific IED. The index vectors $M_P$ and $M_A$ show the IEDs that have identified primary monitoring zone events and adjacent monitoring zone events in their monitoring zones, respectively. The index vectors $I_{P,F}$ and $I_{P,nF}$ show the primary monitoring zone event type subclasses that represent faults and non-faults, respectively. Similarly, the index vectors $I_{A,F}$ and $I_{A,nF}$ show the adjacent monitoring zone event type subclasses that represent faults and non-faults. For each IED two probability values are selected this way; the maximum fault subclass probability value and the maximum non-fault subclass probability value.

In a fourth step S4 a respective total probability $r_{A,F}$, $r_{A,nF}$, $r_{P,F}$, $r_{P,nF}$, is determined that the event belongs to the first class based on the highest probability values from the first class, that the event belongs to the second class based on the highest probability values from the second class, that the event belongs to the third class based on the highest probability values from the third class, and that the event belongs to the fourth class based on the highest probability values from the fourth class. The total probabilities can by means of joint density functions be determined according to the following equations.

$$r_{P,F} = Pr(t_{M_P} | C_{P,F}) = \prod_{k \in M_P} R_{P,F}[k], \quad (3)$$

$$r_{P,nF} = Pr(t_{M_P} | C_{P,nF}) = \prod_{k \in M_P} R_{P,nF}[k],$$

$$r_{A,F} = Pr(t_{M_A} | C_{A,F}) = \prod_{k \in M_A} R_{A,F}[k],$$

$$r_{A,nF} = Pr(t_{M_A} | C_{A,nF}) = \prod_{k \in M_A} R_{A,nF}[k].$$

The vectors $t_{M_P}$ and $t_{M_A}$ contain the feature values determined by the IEDs, or alternatively by the system 1, for primary monitoring zone and adjacent monitoring zone events, respectively, as described in e.g. U.S. patent application Ser. No. 13/155,236.

In a fifth step S5 it is determined whether the event is a fault or a non-fault based on the total probabilities of the first class, the second class, the third class and the fourth class.

According to one embodiment a scaled total probability is determined for each total probability using prior probabilities that the event is a fault or a non-fault. In such an embodiment the fifth step S5 of determining whether the event is a fault or a non-fault is based on the scaled total probabilities. The prior probability that the event is a fault $\xi_F$ and the prior probability that the event is a non-fault $\xi_{nF}$ should add up to one. The scaled probabilities are values of discriminant functions $D_{A,F}$, $D_{A,nF}$, $D_{P,F}$, and $D_{P,nF}$.

$$D_{P,F} = \frac{\xi_F r_{P,F}}{\xi_F r_{P,F} + \xi_{nF} r_{P,nF}}, \quad D_{P,nF} = \frac{\xi_{nF} r_{P,nF}}{\xi_F r_{P,F} + \xi_{nF} r_{P,nF}} \quad (4)$$

$$D_{A,F} = \frac{\xi_F r_{A,F}}{\xi_F r_{A,F} + \xi_{nF} r_{A,nF}}, \quad D_{A,nF} = \frac{\xi_{nF} r_{A,nF}}{\xi_F r_{A,F} + \xi_{nF} r_{A,nF}}$$

According to one embodiment a fault value $D_F$ is determined based on the scaled total probabilities of the first class $D_{A,F}$ and the third class $D_{P,F}$, and a non-fault value based on the scaled probabilities of the second class $D_{A,nF}$ and the fourth class $D_{P,nF}$.

$$D_F = D_{P,F} + w_A D_{A,F}$$

$$D_{nF} = D_{P,nF} + w_A D_{A,nF} \quad (5)$$

In such an embodiment the fifth step S5 of determining whether the event is a fault or a non-fault is determined based on the largest of the fault value $D_F$ and the non-fault value $D_{nF}$.

Thus, at this point it has been determined in the first node N1 whether the event is a fault or a non-fault. The next step is to determine the specific type of fault or non-fault. The type of fault or non-fault can be determined from the fault or non-fault subclasses.

The process continues in node N2 in case it has been determined that the event is a fault. If the number of third class probability values is greater than zero, one probability is determined for each primary monitoring zone fault subclass. Each of these probabilities can be determined by multiplying those probability values of a column in the data structure which are associated with a specific primary monitoring zone fault subclass. Each of the elements in the data structure which are multiplied this way is associated with an IED associated with a primary monitoring zone fault. Thus, for each primary monitoring zone fault subclass, a value D[j], where j indicates the column number, is calculated.

$$D[j] \leftarrow \prod_{k \in M_p} R[k, j], j \in I_{P,F} \qquad (6)$$

$I_{P,F}$ is the index set of those columns which are associated with a primary monitoring zone fault.

The type of primary monitoring zone fault can thereby be determined by selecting the greatest value of the probabilities, i.e. by selecting $$\underset{j \in I_{P,F}}{\mathrm{argmax}}\{D[j]\}.$$

In case it has been determined that the event is a fault, and if the number of third class probability values is equal to zero, a probability for each adjacent monitoring zone fault subclass is determined. Each of these probabilities can be determined by multiplying those probability values of a column in the data structure which are associated with a specific adjacent monitoring zone fault subclass. Each of the elements in the data structure which are multiplied this way is associated with an IED associated with an adjacent monitoring zone fault. Thus, for each adjacent monitoring zone fault subclass, a value D[j], where j indicates the column number, is calculated.

$$D[j] \leftarrow \prod_{k \in M_p} R[k, j], j \in I_{A,F} \qquad (7)$$

$I_{A,F}$ is the index set of those columns which are associated with an adjacent monitoring zone fault.

The type of adjacent monitoring zone fault can be determined by selecting the greatest value of the probabilities, i.e. by selecting $$\underset{j \in I_{A,F}}{\mathrm{argmax}}\{D[j]\}.$$

The process continues in node N3 in case it has been determined that the event is a non-fault. If the number of fourth class probability values is greater than zero, a probability for each primary monitoring zone non-fault subclass is determined. Each of these probabilities can be determined by multiplying those probability values of a column in the data structure which are associated with a specific primary monitoring zone non-fault subclass. Each of the elements in the data structure which are multiplied this way is associated with an IED associated with a primary monitoring zone non-fault. Thus, for each primary monitoring zone non-fault subclass, a value D[j], where j indicates the column number, is calculated.

$$D[j] \leftarrow \prod_{k \in M_p} R[k, j], j \in I_{P,nF} \qquad (8)$$

$I_{P,nF}$ is the index set of those columns which are associated with a primary monitoring zone non-fault.

The type of primary monitoring zone non-fault can be determined by selecting the greatest value of the probabilities, i.e. by selecting $$\underset{j \in I_{P,nF}}{\mathrm{argmax}}\{D[j]\}.$$

In case it has been determined that the event is a non-fault, and if the number of fourth class probability values is zero, a probability for each adjacent monitoring zone non-fault subclass is determined. Each of these probabilities can be determined by multiplying those probability values of a column in the data structure which are associated with a specific adjacent monitoring zone non-fault subclass. Each of the elements in the data structure which are multiplied this way is associated with an IED associated with an adjacent monitoring zone non-fault. Thus, for each adjacent monitoring zone non-fault subclass, a value D[j], where j indicates the column number, is calculated.

$$D[j] \leftarrow \prod_{k \in M_p} R[k, j], j \in I_{A,nF} \qquad (9)$$

$I_{A,nF}$ is the index set of those columns which are associated with an adjacent monitoring zone non-fault.

The type of adjacent monitoring zone non-fault can be determined by selecting the greatest value of the probabilities, i.e. by selecting $$\underset{j \in I_{A,nF}}{\mathrm{argmax}}\{D[j]\}.$$

The results of the event classification may in a sixth step S6 be presented on the display screen 9 to an operator as a single conclusion. Thereby the operator will be able to determine the corresponding mitigation actions.

Figure 5:
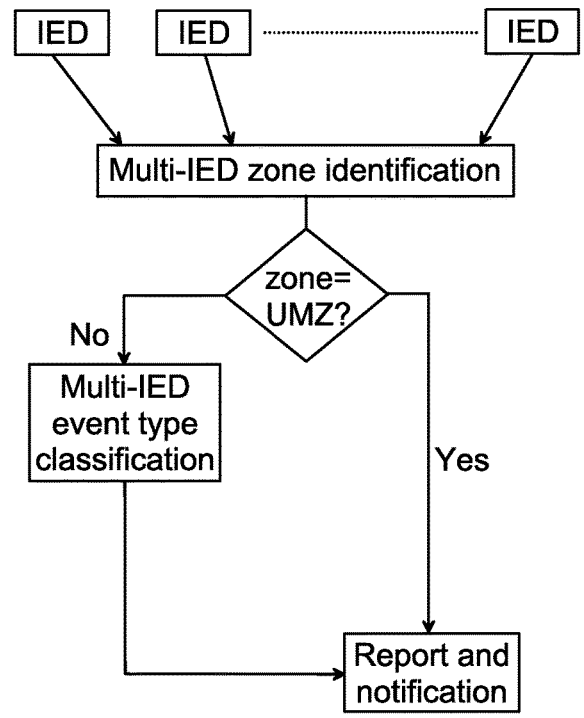
FIG. 5 is a flowchart of a method of identifying an event zone subject to an event and to classify the event.

FIG. 5 shows a method of monitoring zone identification in a multi-IED environment combined with the event classification method which has been presented hereabove.

Advantageously, in one embodiment, the event classification may be preceded by the method of monitoring zone identification. Thereby it can first be determined whether the event occurred in the non-primary monitoring zone, i.e. in the upstream monitoring zone which is in the transmission network upstream of the busbar system 11. In case the event occurred in the upstream monitoring zone, the algorithm does not have to continue to event classification as the upstream monitoring zone is generally not the responsibility of the distribution utility operator.

According to the combined method, the operator is presented with a single conclusion regarding where the event takes place, i.e. in which monitoring zone, and how the event is classified.

Figure 6:
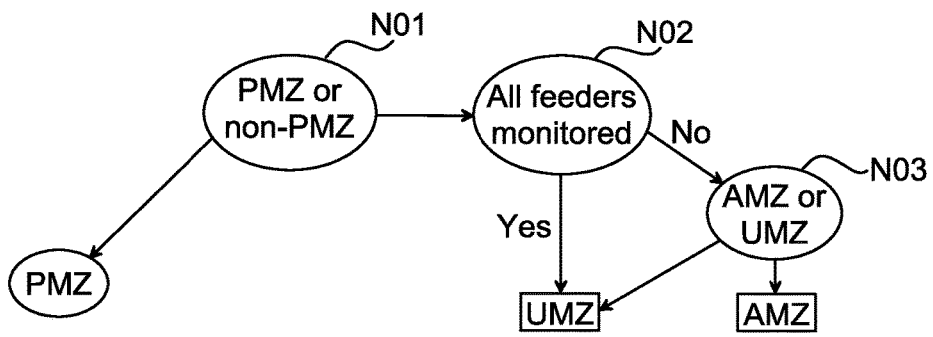
FIG. 6 shows a decision tree utilised for identifying the event zone subject to the event.

FIG. 6 shows a decision tree utilised for determining the monitoring zone subject to an event. The decision tree has a first decision node N01, a second decision note N02, and a third decision node N03 where decisions are taken, as will be explained in detail in what follows.

In case of an event in the substation environment of the power distribution system, in the first decision node N01 it is determined whether the event occurred in at least one primary monitoring zone, i.e. that the event took place in at least one of the feeders which has an IED assigned to it for monitoring purposes, or if the event occurred in the non-primary monitoring zone of all the IEDs.

Figure 7:
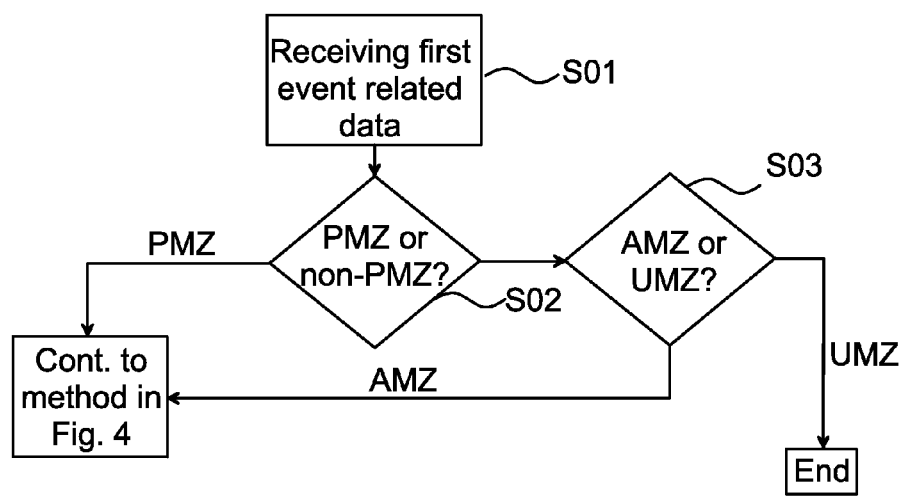
FIG. 7 is a flowchart of the event zone identification part of the method shown in FIG. 5.

In case of a fault, in a step S01, the input unit 3 of the system 1 receives first event related data from the IEDs I1-I7, as shown in FIG. 7. The first event related data may for instance be a subset or a superset of the event related data.

Thus, according to the example in FIG. 2, first event related data is received by the system 1 from each IED I1-I7 in case the breaker of the bus tie is in its closed state.

According to one embodiment, the first event related data comprises individual first event related data from those IEDs I1-I7 which together with their associated feeders F1-F7 form an electrically connected system with the busbar system 11. Thus, according to the example of FIG. 2, if the breaker of bus tie 11-3 is open, whereby the first bus 11-1 is not connected to the second bus 11-2 and hence do not form an electrically connected system in busbar system 11, the methods described herein are based on individual event related data and first and second event related data provided by IEDs connected to the same bus, e.g. either the IEDs I1-I4 connected to the first bus 11-1 or the IEDs I5-I7 connected to the second bus 11-2 in the example of FIG. 2. If several buses are connected by bus ties, event related data from all the IEDs of the connected buses are used in the methods described herein.

According to one embodiment, in case that the IEDs are able to determine respective probability values that the event is a primary monitoring zone event and that the event is an adjacent monitoring zone event, individual first event related data received from each IED I1-I7 comprises a probability value concerning the event being a primary monitoring zone event for an IED and a probability value concerning the event being an adjacent monitoring zone event for that IED. Such probabilities can be based on the density functions $P_{P,i}(x_i)$ and $P_{A,i}(x_i)$, i=1, . . . , N with the argument $x_i$ being event feature data computed by an IED assigned to monitor feeder i based on event measurements associated with that IED. $P_{P,i}(x_i)$ is the density function for event feature data $x_i$ when the event takes place in the i:th feeder. $P_{A,i}(x_i)$ is the density function for the event feature data $x_i$ assuming that the event takes place in an adjacent feeder.

In case the IEDs do not have software capable of determining primary monitoring zone and adjacent monitoring zone probabilities for an event, according to one embodiment these probabilities can be determined by the system 1 based on first event related data which in this case is in the form of event measurements associated with each IED.

The computation of the respective event related data and event feature data in an IED is disclosed in U.S. application Ser. No. 13/155,249.

In a step S02 it is determined whether the at least one monitoring zone subject to the event is a primary monitoring zone of at least one of the intelligent electronic devices or a non-primary monitoring zone for all of the intelligent electronic devices.

The step S02 comprises determining:
I. a conditional probability that the first event related data is a result of the event having occurred in an adjacent monitoring zone of all intelligent electronic devices;
II. conditional probabilities for each intelligent electronic device that the first event related data is a result of the event having occurred in the primary monitoring zone of one of the intelligent electronic devices; and
III. conditional probabilities that the first event related data is a result of the event having occurred in a primary monitoring zone of more than one intelligent electronic device.

The determining of whether the event occurred in at least one primary monitoring zone or in a non-primary monitoring zone is based on the above-mentioned conditional probabilities.

I) involves determining the probability of the hypothesis $H_0$ that the event E occurred in the adjacent monitoring zone to all IEDs I1-I7. This means that the observed event belongs to a class $C_0$, i.e. a monitoring zone which is adjacent to all IEDs I1-I7. For a substation environment having N IEDs, the conditional probability is determined by the joint density function:

$$Pr(x \mid C_0) = P_0(x_1, \ldots, x_N) = \prod_{i=1}^{N} P_{A,i}(x_i). \tag{10}$$

x denotes a feature vector comprising event extraction data $x_i$ from all the IEDs, i.e. $x=(x_1, \ldots x_N)$. The second equality in equation (1) holds due to the assumption that the individual first event feature data, i.e. the components of the feature vector x, are statistically independent.

The second equality in equation (10) holds due to the assumption that the individual first event related data, i.e. the components of the feature vector x, are statistically independent.

II) involves determining the probability of the hypothesis $H_i$, i=1, . . . , N that the event E occurred in one and only one of the feeders being monitored by an IED, in the example of FIG. 2 feeders F1-F7. This means that the observed event belongs to a class $C_i$, i=1, . . . , N, i.e. a primary monitoring zone of one of the IEDs. For a substation environment having N IEDs, the conditional probabilities are determined by the joint density functions:

$$Pr(x \mid C_j) = P_{P,j}(x_j) \prod_{\substack{i=1 \\ i \neq j}}^{N} P_{A,i}(x_i), \quad j = 1, \ldots, N \tag{11}$$

This way, the conditional probability that the class is $C_i$, i.e. that the event occurred in only one primary monitoring zone for the feature vector x can be determined.

III) involves determining the probability of a plurality of hypotheses H that the event E occurred in more than one of the feeders being monitored by an IED, in the example of FIG. 2 more than one of the feeders F1-F7. This could for instance be the case if two or more feeders are damaged by an excavator. For this purpose, one hypothesis for each combination of feeders being monitored by an IED is tested. As an example, for the first bus 11-1 in FIG. 2, the possible combinations of a simultaneous event in two or more feeders monitored by a respective IED I1-I4 are: F1 and F2; F1 and F3; F1 and F4; F2 and F3; F2 and F4; F3 and F4; F1 and F2 and F3; F1 and F3 and F4; F2 and F3 and F4; F1 and F2 and F3 and F4.

For a substation environment having N IEDs, the conditional probabilities are determined by the joint density functions:

$$Pr(x|C_{j1,\ldots,jN}) = P_{P,j1}(x_{j1}) \ldots P_{P,j}(x_{jN}) \prod_{i \neq (j1 \ldots jN)}^{N} P_{A,i}(x_i). \quad (12)$$

Here $(j_1, \ldots, j_N) \in I_q$ is the index set of all N combinations of the indexes and $C_{j1,\ldots,jN}$ corresponds to classes of the different feeder combinations being monitored by an IED. Thus for example $C_{1,2,3}$ stands for the class that the event occurred simultaneously in feeders F1, F2 and F3.

Based on all the conditional probabilities determined under items I-III above, it can be determined whether the event occurred in at least one primary monitoring zone, or in a non-primary monitoring zone. This can in particular be determined by taking the maximum of all of the determined conditional probabilities.

According to one embodiment, a respective weighted probability value for each of the determined conditional probabilities is determined. The weights are based on prior probability that the event occurred in an adjacent monitoring zone for each intelligent electronic device, that the event occurred in a primary monitoring zone of one intelligent electronic device, and that the event occurred in a primary monitoring zone for more than one intelligent electronic device. Hence a priori knowledge is incorporated in the calculations for determining whether the event occurred in at least one primary monitoring zone or in a non-primary monitoring zone. The prior probabilities can be divided into three groups:

Group 1: prior probabilities for upstream monitoring zone events and adjacent monitoring zone events when at least one feeder in the substation is not monitored.

Group 2: prior probabilities for single primary monitoring zone events.

Group 3: prior probabilities for multiple primary monitoring zone events.

The prior probabilities should add up to one, and there are as many prior probabilities as there are hypotheses. The prior probabilities are denoted by $\xi_k$. Each prior probability $\xi_k$ can be seen as a weight. According to one embodiment, each conditional probability determined under items I-III above, is multiplied by its respective prior probability to thereby obtain the weighted probabilities. Thus, for instance the weighted probability for class $C_0$ is $$D_0^{NB}(x) = \xi_0 \cdot Pr(x|C_0). \quad (13)$$

NB denotes naïve Bayes. The remaining weighted probabilities, i.e. the weighted probabilities for each hypothesis, are determined in a similar manner. The function $D_0^{NB}$ is called a discriminant function, and thus one discriminant function is created for each hypothesis. By determining each weighted probability, a Bayes classifier can be determined for the first node N1. The Bayes classifier denotes the maximum of all the discriminant functions. For four IEDs, the Bayes classifier is:

$$h^{NB}(x) = \underset{j \in I_1, (k,m) \in I_2, (n,p,q) \in I_3}{\operatorname{argmax}} \{D_0^{NB}, D_j^{NB}, D_{k,m}^{NB}, D_{n,p,q}^{NB}, D_{1,2,3,4}^{NB}\}. \quad (14)$$

Here, $I_1$ denotes the index set $\{1, 2, 3, 4\}$, $I_2$ denotes the index set of all 2-combinations of numbers of the set $\{1, 2, 3, 4\}$, and $I_3$ denotes the index set of all 3-combinations of numbers of the set $\{1, 2, 3, 4\}$. Generally, the number $K_q$ of q-combinations is calculated by means of the formula $$K_q = \binom{N}{q}.$$

In embodiments where weighted probability values are determined, it is determined whether the event occurred in a primary monitoring zone or a non-primary monitoring zone is based on the highest value of the weighted probabilities. Each conditional probability and hence each weighted probability is typically associated with the underlying assumptions of being a primary monitoring zone of one or more IED. Hence, in one embodiment, if it is determined that the event occurred in at least one primary monitoring zone, the at least one primary monitoring zone in which the event occurred is identified based on the association of the at least one primary monitoring zone with its associated weighted probability value or underlying discriminant function.

So far, the method steps in the first decision node N01 have been described. In the following the method steps of the second decision node N02 and the third decision node N03 will be described in more detail.

In the second decision node N02, if it has been determined that the event is a non-primary monitoring zone event and all the feeders are monitored by an IED, it is determined that the event occurred in the upstream monitoring zone. The operator can be presented with this information on the display device 9. Upstream events are however typically not under the responsibility of the same unit within the utility. Thus, normally no action from the operator is necessary, other than perhaps notifying the transmission network owner/operator.

In node N03 which is the case the event occurred in a non-primary monitoring zone and not all feeders are monitored by an IED, second event related data received from the IEDs is utilised for determining whether the event occurred in the upstream monitoring zone or in a feeder, such as feeder F8 in FIG. 2, which is not monitored by an IED. The second event related data can for instance be a respective feature calculated in a respective IED, for instance from an autocorrelated sequence of the isolated transient captured at the time of the event by applying linear discriminant function. Alternatively, the second event related data can comprise joint density functions provided by each IED, and using the above-mentioned feature of the isolated transient in its argument. These aspects are described in more detail in U.S. patent application Ser. No. 13/155,249, e.g. on page 46, line 23 and onwards. In case the IEDs are not capable of determining the specific features to be provided with the second event related data, the system 1 may receive measurement data from the IEDs and process the measurement data accordingly. The second event related data can be received from the IEDs either about at the same time as the first event related data was received, or later. The first event related data and the second event related data may be subsets of a general event related data sent by each IED.

A conditional probability that the first event related data is a result of the event having occurred in an adjacent monitoring zone for all intelligent electronic devices is determined and a conditional probability that the first event related data is a result of the event having occurred in the upstream monitoring zone is determined based on the second event related data.

The conditional probability that the event occurred in an adjacent monitoring zone for all intelligent electronic devices, i.e. an unmonitored feeder zone, is determined e.g. by means of the following joint density function:

$$Pr(x|C_A) = \prod_{i=1}^{N} U_{A,i}(y_i). \quad (15)$$

$C_A$ is the class that the event occurred in a feeder which is not monitored by any IEDs. $U_{A,i}(y_i)$ is the density function of an individual second event related data pertaining to an IED which is assigned to monitor the i:th feeder with the event taking place in an adjacent monitoring zone.

The conditional probability that the event occurred in the upstream monitoring zone is determined e.g. by means of the joint density function:

$$Pr(x|C_U) = \prod_{i=1}^{N} U_{U,i}(y_i). \quad (16)$$

$C_U$ is the class that the event occurred in a feeder which is not monitored by any IEDs. $U_{U,i}(y_i)$ is the density function of an individual second event related data pertaining to an IED which is assigned to monitor the i:th feeder with the event taking place in the upstream monitoring zone.

In a step S03 it is determined whether the event occurred in an adjacent monitoring zone or the upstream monitoring zone based on the conditional probabilities $Pr(x|C_A)$ and $Pr(x|C_U)$.

According to one embodiment, a weighted probability value for each of the determined second event data conditional probabilities is determined based on prior probability that the event occurred in an adjacent monitoring zone for each intelligent electronic device and that the event occurred in the upstream monitoring zone. Hence a priori knowledge is incorporated in the calculations for determining whether the event occurred in an adjacent monitoring zone to all IEDs or in the upstream monitoring zone.

The prior probabilities should add up to one, and there are as many prior probabilities as there are hypotheses, in this case two. The prior probability that the event occurred in an adjacent monitoring zone to all IEDs is denoted by $\xi_A$. The prior probability that the event occurred in the upstream monitoring zone is denoted by $\xi_U$. Each prior probability $\xi_A$ and $\xi_U$ can be seen as a weight. According to one embodiment, the conditional probabilities $Pr(x|C_A)$ and $Pr(x|C_U)$ are multiplied by their respective prior probabilities $\xi_A$ and $\xi_U$ to obtain the weighted probabilities. Thus, the weighted probability for a specific feature vector value x for the classes $C_A$ and $C_U$ are $$D_A^{NB}(x) = \xi_A \cdot Pr(x|C_A), \text{ and} \quad (17)$$

$$D_U^{NB}(x) = \xi_U \cdot Pr(x|C_U) \text{ respectively.} \quad (18)$$

The functions $D_A^{NB}(x)$ and $D_U^{NB}(x)$ are called discriminant functions. By determining each weighted probability, a Bayes classifier can be determined for the third node N3. The Bayes classifier denotes the maximum of all the discriminant functions. The Bayes classifier is:

$$h^{NB}(x) = \underset{\{A,U\}}{\operatorname{argmax}}\{D_A^{NB}, D_U^{NB}\}. \quad (19)$$

In one embodiment step S03 of determining whether the event occurred in an adjacent monitoring zone or upstream of the busbar system is based on the highest value of the weighted probabilities. Whether the event occurred in an adjacent monitoring zone to all IEDs or in the upstream monitoring zone is determined based on the association between the weighted probability values and their underlying hypotheses.

The inventive concept has mainly been described above with reference to a few embodiments. However, as is readily appreciated by a person skilled in the art, other embodiments than the ones disclosed above are equally possible within the scope of the invention, as defined by the appended claims.

The invention claimed is:

1. A method of classifying an event in an electrical grid having a busbar system with a plurality of feeders and a plurality of intelligent electronic devices monitoring at least a portion of the feeders, wherein the method comprises:
    obtaining individual event related data from the plurality of intelligent electronic devices,
    receiving, via an input unit, said individual event related data from the plurality of intelligent electronic devices over a communications network,
    arranging in a data structure, in real-time as the individual event related data is processed via a processing unit, classes of probability values pertaining to the individual event related data received from the plurality of intelligent electronic devices, that according to a first class the event is an adjacent monitoring zone fault and that according to a second class the event is an adjacent monitoring zone non-fault, or that according to a third class the event is a primary monitoring zone fault and that according to a fourth class the event is a primary monitoring zone non-fault for each intelligent electronic device,
    a primary monitoring zone of an intelligent electronic device being a monitoring zone which that intelligent electronic device is assigned to monitor and an adjacent monitoring zone of an intelligent electronic device being a monitoring zone that is not a primary monitoring zone for that intelligent electronic device,
    selecting in the data structure, via the processing unit, a highest probability value from each of the first class and the second class, or each of the third class and the fourth class, for each intelligent electronic device,
    determining, via the processing unit, a respective total probability that the event belongs to the first class based on the highest probability values from the first class, that the event belongs to the second class based on the highest probability values from the second class, that the event belongs to the third class based on the highest probability values from the third class, and that the event belongs to the fourth class based on the highest probability values from the fourth class,
    determining, via the processing unit, whether the event is a fault or a non-fault based on the total probabilities of the first class, the second class, the third class and the fourth class, and
    applying a result of the determination of whether the event is a fault or a non-fault in controlling a protection system in real-time to initiate mitigation actions for restoring power in response to the event.

2. The method as claimed in claim 1, comprising determining a scaled total probability for each total probability using prior probabilities that the event is a fault or a non-fault, wherein the determining whether the event is a fault or a non-fault is based on the scaled total probabilities.

3. The method as claimed in claim 2, comprising determining a fault value based on the scaled total probabilities of the first class and the third class, and a non-fault value based on the scaled probabilities of the second class and the fourth class, wherein the determining whether the event is a fault or a non-fault is determined based on the largest of the fault value and the non-fault value.

4. The method as claimed in claim 1, wherein the arranging comprises associating the probability values of each row of the data structure with a specific intelligent electronic device.

5. The method as claimed in claim 1, wherein the arranging comprises associating each column of the data structure, in rows associated with intelligent electronic devices associated with probabilities that the event is a first class or second class event, with a fault or non-fault adjacent monitoring zone subclass.

6. The method as claimed in claim 1, wherein the arranging comprises associating each column of the data structure, in rows associated with intelligent electronic devices associated with probabilities that the event is a third class or fourth class event, with a primary monitoring zone fault or non-fault subclass.

7. The method as claimed in claim 1, comprising determining the number of third class probability values and the number of fourth class probability values.

8. The method as claimed in claim 7, comprising, in case it has been determined that the event is a fault and if the number of third class probability values is greater than zero, determining a probability for each primary monitoring zone fault subclass, and determining the type of primary monitoring zone fault by selecting the greatest value of the probabilities.

9. The method as claimed in claim 7, comprising, in case it has been determined that the event is a fault, and if the number of third class probability values is equal to zero, determining a probability for each adjacent monitoring zone fault subclass, and determining the type of adjacent monitoring zone fault by selecting the greatest value of the probabilities.

10. The method as claimed in claim 7, comprising, in case it has been determined that the event is a non-fault, and if the number of fourth class probability values is greater than zero, determining a probability for each primary monitoring zone non-fault subclass, and determining the type of primary monitoring zone non-fault by selecting the greatest value of the probabilities.

11. The method as claimed in claim 7, comprising, in case it has been determined that the event is a non-fault, and if the number of fourth class probability values is zero, determining a probability for each adjacent monitoring zone non-fault subclass, and determining the type of adjacent monitoring non-fault by selecting the greatest value of the probabilities.

12. A computer program product comprising computer-executable components for causing a system to perform the steps recited in claim 1 when the computer-executable components are run on a processing unit included in the system.

13. A system for classifying an event in an electrical grid having a busbar system with a plurality of feeders and a plurality of intelligent electronic devices monitoring at least a portion of the feeders, wherein the system for classifying an event comprises:
an input unit arranged to receive individual event related data from the plurality of intelligent electronic devices over a communications network,
a processing unit configured to arrange in real-time as the individual event related data is processed, in a data structure, classes of probability values pertaining to the individual event related data received from the plurality of intelligent electronic devices, that according to a first class the event is an adjacent monitoring zone fault and that according to a second class the event is an adjacent monitoring zone non-fault, or that according to a third class the event is a primary monitoring zone fault and that according to a fourth class the event is a primary monitoring zone non-fault for each intelligent electronic device, a primary monitoring zone of an intelligent electronic device being a monitoring zone which that intelligent electronic device is assigned to monitor and an adjacent monitoring zone of an intelligent electronic device being a monitoring zone that is not a primary monitoring zone for that intelligent electronic device,
the processing unit is further configured to select in the data structure a highest probability value from each of the first class and the second class, or each of the third class and the fourth class, for each intelligent electronic device, to determine a respective total probability that the event belongs to the first class based on the highest probability values from the first class, that the event belongs to the second class based on the highest probability values from the second class, that the event belongs to the third class based on the highest probability values from the third class, and that the event belongs to the fourth class based on the highest probability values from the fourth class, and to determine whether the event is a fault or a non-fault based on the total probabilities of the first class, the second class, the third class and the fourth class, and
an output unit configured to receive and apply a result of the determination of whether the event is a fault or a non-fault from the processing unit in controlling a protection system in real-time to initiate mitigation actions for restoring power in response to the event.

* * * * *